(12) United States Patent
Mohaupt

(10) Patent No.: US 8,542,022 B2
(45) Date of Patent: *Sep. 24, 2013

(54) VLF TEST GENERATOR

(75) Inventor: Peter Mohaupt, Innsbruck (AT)

(73) Assignee: Mohaupt High Voltage GmbH, Mieders, Tirol (AT)

( * ) Notice: Subject to any disclaimer, the term of this patent is extended or adjusted under 35 U.S.C. 154(b) by 366 days.

This patent is subject to a terminal disclaimer.

(21) Appl. No.: 12/994,227

(22) PCT Filed: May 20, 2009

(86) PCT No.: PCT/AT2009/000212
§ 371 (c)(1),
(2), (4) Date: Nov. 23, 2010

(87) PCT Pub. No.: WO2009/143544
PCT Pub. Date: Dec. 3, 2009

(65) Prior Publication Data
US 2011/0062967 A1    Mar. 17, 2011

(30) Foreign Application Priority Data

May 28, 2008  (AT) .................................. A 857/2008

(51) Int. Cl.
*H01H 31/12* (2006.01)
*G01R 31/02* (2006.01)

(52) U.S. Cl.
USPC .............................. 324/551; 324/541; 324/544

(58) Field of Classification Search
USPC .......................................... 324/551, 541, 544
See application file for complete search history.

(56) References Cited

U.S. PATENT DOCUMENTS 6,169,406 B1 * 1/2001 Peschel .......................... 324/548
6,611,148 B2 * 8/2003 Clinton .......................... 324/544

FOREIGN PATENT DOCUMENTS

DE  10333241  11/2004
GB  1008461  10/1965

OTHER PUBLICATIONS

International Search Report from International Application No. PCT/AT2009/000212, issued May 28, 2010.
International Preliminary Report on Patentability issued Dec. 16, 2010 from related International Application No. PCT/AT2009/000212.

* cited by examiner

*Primary Examiner* — Amy He
(74) *Attorney, Agent, or Firm* — Hoffmann & Baron, LLP

(57) ABSTRACT

Disclosed is a very low frequency test generator for generating a high voltage having a low frequency in order to test the insulation of capacitive loads, in particular power cables. Said VLF test generator comprises two oscillators, the frequencies of which differ from one another by twice said low frequency, a resonance circuit which is fed in an interfering manner by the oscillators, is adjusted to the oscillator frequencies and causes a voltage rise of the interfering oscillator frequencies, and a demodulator for disconnecting the low-frequency high voltage generated by the interference from the resonance circuit and applying the same to the load.

23 Claims, 4 Drawing Sheets ically a matter of a transformer without iron cores, in order to avoid the problems of mains frequency transformers with direct current components, no weight or space problems occur.

VLF TEST GENERATOR

CROSS-REFERENCE TO RELATED APPLICATIONS

This application is a National Phase application of International Application No. PCT/AT2009/000212 filed May 20, 2009 which claims priority to Austrian Patent Application No. A 857/2008 filed May 28, 2008.

BACKGROUND

The present invention relates to a VLF test generator for generating a high voltage with a low frequency to test the insulation of capacitive loads, in particular power cables.

Testing with high voltages of very low frequency (VLF) in the range of a tenth of a hertz has become established for energy-related testing of the insulation of highly capacitive loads such as underground cable systems. In contrast to mains frequency or higher frequency test voltages, VLF test voltages only generate low reactive power in the capacitive load, and therefore the test generator can be of appropriately smaller design; and compared to d.c. voltage tests used previously VLF test voltages prevent the build-up of damaging space and residual charges in the cable system that can lead to disruptive breakdowns later during operation.

However, the generation of suitable VLF test voltages in the high voltage range, i.e. with up to some hundreds of kilovolts, is not at all simple, since high-voltage transformers are not practicable for such low frequencies. Therefore, a wide variety of switching systems have already been proposed for VLF test generators, which all, however, have either a high connection expenditure or components that are costly or fault-prone.

Thus, a VLF test generator of the aforementioned type is known from patent DE 103 33 241 B that uses a regulating transformer with motor-driven adjustment in order to modulate a mains frequency high voltage by periodic adjustment of the transformer in amplitude. The amplitude-modulated high voltage is stepped up and the modulation frequency is then recovered as VLF high voltage by means of a demodulator. The use of a regulating transformer operated by electric motor makes this solution unmanageable, fault-prone and only usable for low test power values.

Other known designs use complex high-voltage semiconductor switching systems in order to firstly rectify a mains frequency high voltage and then regulate it periodically by means of controlled semiconductor switches, in the manner of a high-voltage inverter as it were, in order to generate a VLF high voltage. While these designs manage without mechanical components, they still require extensive power electronics that also have a high cooling requirement.

The aim of the invention is to overcome the disadvantages of the known prior art and provide a VLF test generator for the generation of low-frequency high voltages, which can be achieved simply and inexpensively, is low in weight for a transportable use on site, is sturdy and not fault-prone and has only a low cooling requirement.

SUMMARY

This aim is achieved with a VLF test generator of the type mentioned in the introduction that is distinguished according to the invention by two oscillators, the oscillator frequencies of which differ from one another by twice said low frequency, a resonant circuit, which is fed in an interfering manner by the oscillators and is tuned to the oscillator frequencies, for voltage superelevation of the interfering oscillator frequencies, and a demodulator for decoupling the low-frequency high voltage generated by the interference from the resonant circuit and applying same to the load.

In contrast to all the known solutions, the invention is based on the new approach of using the interference or beat between two slightly different oscillators to generate a low-frequency modulation in a resonant circuit, which at the same time causes a voltage superelevation of the interference product. In this way, an output voltage of very high amplitude and very low frequency can be generated with surprisingly few components. Fault-prone mechanical elements or complex power electronics with a high cooling requirement are completely unnecessary. Because of its very low weight, space requirement and its sturdiness the VLF test generator is particularly suitable for transportable use during insulation tests on site, e.g. on underground power cables.

In the VLF test generator according to the invention oscillators with oscillator frequencies lying far above the mains frequency can be used, since only their difference in frequency is relevant for the generation of the VLF test voltage. The oscillator frequencies preferably lie in the range of 100 Hz to 10 kHz, particularly preferred in the range of 500 Hz to 5 kHz, especially preferred at about 1 kHz. As a result, components that are critical in terms of volume and weight such as the choke of the resonant circuit or optional matching transformers, can be dimensioned significantly smaller.

It is particularly advantageous if said low frequency lies below 1 hertz, preferably at about 0.1 hertz. As known per se, only extremely low reactive power values occur in the load circuit in the case of such low frequencies, so that the test generator can be dimensioned for a correspondingly low power.

In a preferred embodiment of the invention the quality of the resonant circuit amounts to 10 to 100, particularly preferred 50 to 80. This represents an excellent compromise between maximum voltage superelevation and good matching ability of the resonant circuit.

The interference of the oscillator frequencies can occur as a result of interference both of the oscillator output currents and the voltages. The interference is preferably a voltage interference. As a result, the resonant circuit can already be excited with twice the voltage amplitude and twice the generator output voltage can be reached after the voltage superelevation in the resonant circuit.

The voltage superelevation in the resonant circuit also provides the possibility in particular of using conventional controllable semiconductor inverters for the oscillators, as known in the form of so-called power modules, and e.g. can generate any desired output voltage curves of up to 400 V from a mains frequency supply voltage of 400 V. Output voltages in the range of some tens of kV can be obtained therefrom solely as a result of the voltage superelevation in the resonant circuit.

It is particularly favourable if, according to a further feature of the invention, the oscillators feed the resonant circuit via at least one transformer, as a result of which an electrical separation of the oscillators from the resonant, and thus the high-voltage, circuit can be achieved and negative reactions of transient processes of the high voltage side on the oscillators can be prevented. Moreover, an inductive load can be provided for the oscillator outputs in this way, as is required, for example, by the said power modules.

A particularly advantageous embodiment of the invention is distinguished in that the transformers are simultaneously used to step up the oscillator voltages for feeding into the resonant circuit. The output voltage of the VLF test generator can be increased once again as a result. Because the voltage is increased twice, once by the feed or exciter transformer for the resonant circuit and a second time by the voltage superelevation in the resonant circuit itself, VLF test voltages of up to some hundreds of kV, e.g. 400 kV, can be generated starting from oscillator output voltages in the range of some hundreds of volts. A triple voltage increase is even achieved in the case of the preferred voltage interference of the oscillators, once as a result of the voltage interference, once as a result of the stepping up and once as a result of the resonance superelevation.

If desired, the oscillators can be connected to a common primary winding of the transformer, which reduces the component expenditure. According to a particularly preferred variant of the invention, each oscillator has its own primary winding of a common transformer, which is connected to the resonant circuit. This enables the oscillators to be electrically separated from one another.

It is particularly advantageous if the oscillator frequency of one oscillator is derived from the oscillator frequency of the other oscillator, or alternatively the oscillator frequencies of the oscillators are derived from a common clock generator. As a result of the principle of the VLF generation according to the invention by means of beat absolute faults of the oscillator frequencies are compensated so that as a result of a rigid coupling of the oscillators a substantially higher frequency constancy of the VLF oscillation can be achieved than with the known solutions.

The demodulation of the low frequency from the interference product in the resonant circuit can be provided by means of any demodulator circuit known in the art. A particularly simple solution in terms of circuitry results if the demodulator—as known per se from the mentioned specification DE 103 33 241 B—also uses the capacitive load and reverses this by means of a rectifier in the cycle of the low frequency.

Likewise, any rectifier connection system known in the art can be used for the rectifier. It is particularly advantageous if—as known per se from DE 103 33 241 B—the rectifier can be switched over in its transmitting direction and switches over upon each half wave of the low frequency, for which the rectifier preferably has two antiparallel diode branches provided with switches, which is a solution with minimal component requirement.

In a further preferred embodiment of the invention, each diode branch is formed by a chain of diodes and interposed semiconductor switches, as a result of which a high electric strength can be achieved for high output voltages.

According to a further preferred feature of the invention it is provided that the switches are, during switchover, simultaneously closed with a brief overlap. The transient phenomenon of the generator output voltage during switchover of the rectifier can be minimised as a result of this.

A particularly rapid discharge of the load can be promoted and an undesirable potential jump thus prevented during the zero crossing of the generator output voltage if, according to a particularly preferred embodiment of the invention, a discharging resistor for the capacitive load, which connects back to the output of the resonant circuit, is connected in parallel to the demodulator. In relation to conventional switching systems with a permanent load-parallel discharging resistor, the switching system according to the invention has significantly lower power loss; and compared to solutions with a switchable load-parallel discharging resistor, the solution according to the invention does not require a separate switch: for the discharging resistor related to the output potential of the resonant circuit always has a particularly strong effect when the interference product has its beat notes in the resonant circuit and thus comes close to the zero potential.

It is particularly advantageous in this case if, according to a further feature of the invention, a control means is additionally provided for the oscillators, which reduces the amplitude of their output voltages at the end of each second quarter of the period of the low frequency in order to support the discharge of the load via the discharging resistor.

If, as discussed above, the demodulator is formed by the interaction of a rectifier with the capacitive load, a further advantageous embodiment of the invention lies in simply connecting the discharging resistor in parallel to the rectifier.

A further simplification results if, in the case where the diode branches of the rectifier are formed by chains of diodes and interposed semiconductor switches, a single resistor is connected in parallel to each diode and each semiconductor switch, which single resistors jointly form said discharging resistor. The number of required components can be reduced even further as a result of this.

BRIEF DESCRIPTION OF THE DRAWINGS

The invention is explained in more detail below on the basis of an exemplary embodiment represented in the attached drawings.

DETAILED DESCRIPTION

Figure 1:
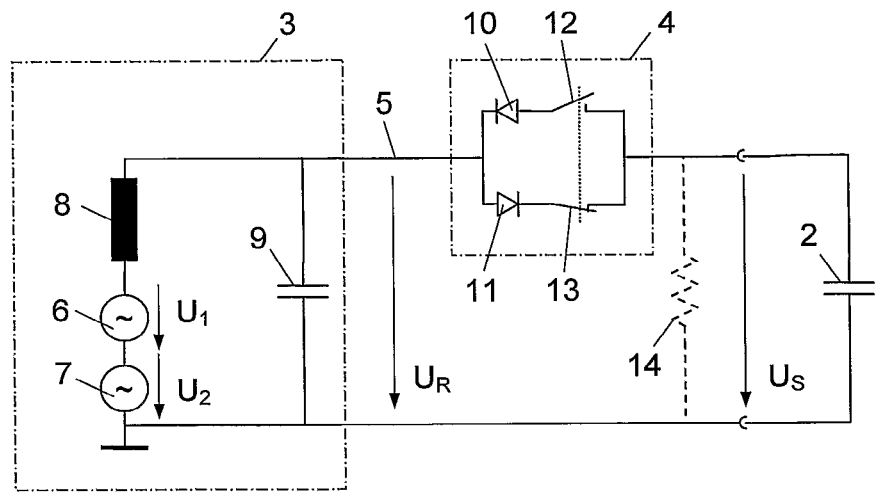
FIG. 1 is a circuit diagram of a first embodiment of the VLF test generator of the invention.

FIG. 1 shows a test generator 1, which generates a high voltage $U_s$ in the range of some 10s to some 100s of kV and with a very low frequency (VLF) in range of few hertz and below. The VLF test generator 1 serves to test the insulation of a capacitive load 2, e.g. an underground high-voltage cable. Such loads 2 generally have a capacity in the range of up to some μF. The further measurement set-up for testing the insulation of the load 2 after applying the low-frequency high voltage $U_s$, in particular for measuring the output voltage, for accompanying diagnostic measurements such as loss factor measurements or partial discharge measurements etc., is of no relevance here and is not represented.

The test generator 1 substantially comprises an oscillator part 3 and a demodulator 4 connected thereto. At an output 5 the oscillator part 3 generates a high voltage $U_R$ of higher frequency, which is modulated in amplitude with the said low frequency, and the demodulator 4 demodulates the modulation product $U_R$ in order to obtain a low-frequency high voltage $U_s$ therefrom as generator output voltage and apply it to the load 2.

As shown in FIG. 1, the oscillator part 3 comprises two oscillators 6, 7, the oscillator frequencies $f_1$, $f_2$ of which differ from one another by twice the desired low frequency $f_s$ of the generator output voltage $U_s$, i.e. $f_2 - f_1 = 2f_s$. The oscillator frequencies $f_1$, $f_2$ are preferably substantially higher than the usual mains frequency of electrical energy distribution networks 50 or 60 Hz), i.e. generally in the range of 100 Hz to 10 kHz, preferably in the range of 500 Hz to 4 kHz, and particularly preferred around 1 kHz, e.g. $f_1$=1000.0 Hz and $f_2$=1000.2 Hz.

Figure 2:
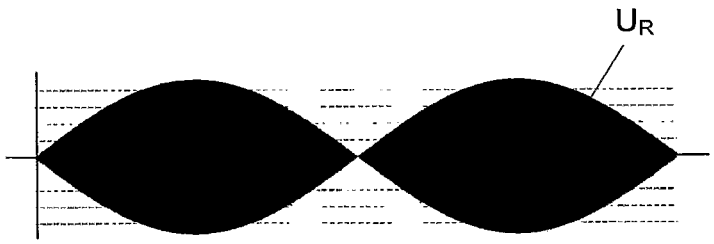
FIG. 2 shows the interference product, the resonance voltage $U_R$, occurring in the resonant circuit.
Figure 3:
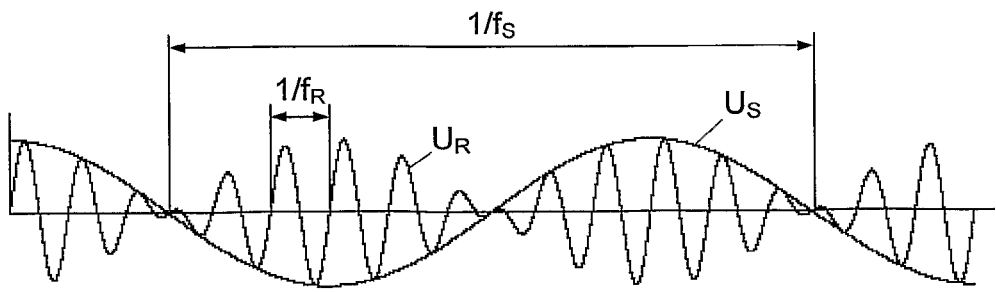
FIG. 3 shows the low-frequency modulation of the resonance voltage $U_R$ in an enlarged view not to scale.

The oscillators 6, 7 feed a resonant circuit formed by a coil 8 and a capacitor 9 jointly in series connection. As a result of the mutual superposition or interference of the oscillator output voltages $U_1$, $U_2$ an interference product occurs in the resonant circuit 8, 9, which can be viewed as oscillation of the frequency $$f_R = \frac{f_1 + f_2}{2}$$

additionally referred to as resonance voltage $U_R$, which is modulated in amplitude with a low-frequency beat $U_s$ of the frequency $$f_S = \frac{f_2 - f_1}{2}$$

as shown in FIGS. 2 and 3.

Since $f_s$=0.1 Hz in the said example, the 10 000-times higher frequency resonance voltage $U_R$ is only visible in FIG. 2 as an area; for better recognition the resonance voltage $U_R$ is shown in FIG. 3 with an enlarged period not to scale.

As a result of the series connection of the oscillators 6, 7, the amplitude of the exciting voltage $U_1+U_2$ of the resonant circuit 8, 9 amounts to twice the amplitudes of the individual oscillator output voltages $U_1$, $U_2$. The resonant circuit 8, 9 is tuned to the frequency $f_R$ or the exciting voltage $U_1+U_2$, so that the resonance voltage $U_R$ at the resonant circuit is superelevated by the quality Q of the resonant circuit compared to the exciting oscillator voltages $U_1+U_2$ and thus 2·Q-times one of the oscillator output voltages $U_1$, $U_2$ is obtained.

The quality Q of the resonant circuit 8, 9 preferably lies between 10 and 100, particularly preferred between 50 and 80. In this way, a resonance voltage $U_R$ in the range of e.g. 60-80 kV can be generated as a result of the voltage interference and the voltage superelevation in the resonance case of the resonant circuit 8, 9 from oscillator output voltages $U_1$, $U_2$ in the range of 3-400 V.

To decouple the low-frequency high voltage $U_s$ from the resonant circuit 8, 9, the demodulator 4 represented here also uses the load 2, i.e. by reversing this by means of a connected rectifier 10-13 in the cycle of the low frequency $f_s$. For this purpose, the demodulator 4 comprises two anti-parallel diode branches 10, 11, which are alternately connected to the output 5 of the resonant circuit 8, 9 by means of corresponding switches 12, 13 on each half wave of the low frequency $f_s$.

To prevent any bounce in the zero crossing of the generator output voltage $U_s$ caused, for example, by drops in voltage in the rectifier 10-13 and/or residual charges in the load 2, a releasing resistor 14 can be optionally connected in parallel to the load 2. The discharging resistor 14 can be connected in parallel to the load 2 permanently or only during the phase of the zero crossing of the output voltage $U_s$ by means of a switch (not shown).

Figure 4:
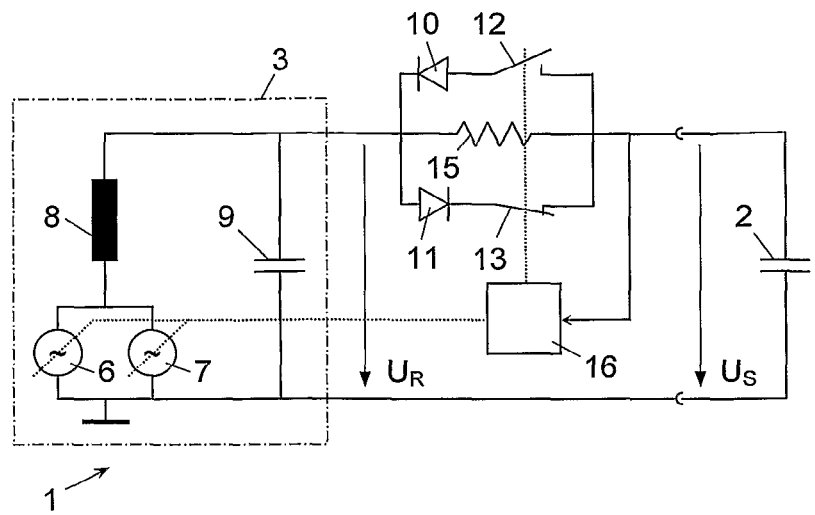
FIG. 4 is a circuit diagram of a second embodiment of the VLF test generator of the invention.

Instead of such a (switchable) load-parallel discharging resistor 14, which causes high power loss and/or requires additional electronic circuitry, the following discharge circuit according to FIG. 4 is preferably used.

FIG. 4 shows an alternative embodiment of the VLF generator of FIG. 1, wherein the same reference numerals relate to the same parts. Alternatively to FIG. 1, in this embodiment the two oscillators 6, 7 are connected in parallel to one another and interfere via their output currents. However, the series connection of FIG. 1 can also be used.

In the embodiment of FIG. 4, moreover, a discharging resistor 15 lies parallel to the demodulator 4 (or more precisely its switchable diode branches 10, 11) and discharges the load 2 towards the potential of the output 5 of the oscillator part 3. As a result, the discharging resistor 15 is particularly effective especially in the zero crossing phase of the output voltage $U_s$, since the output 5 also goes to zero potential there as a result of the junctions of the resonance frequency $U_R$.

Figure 5:
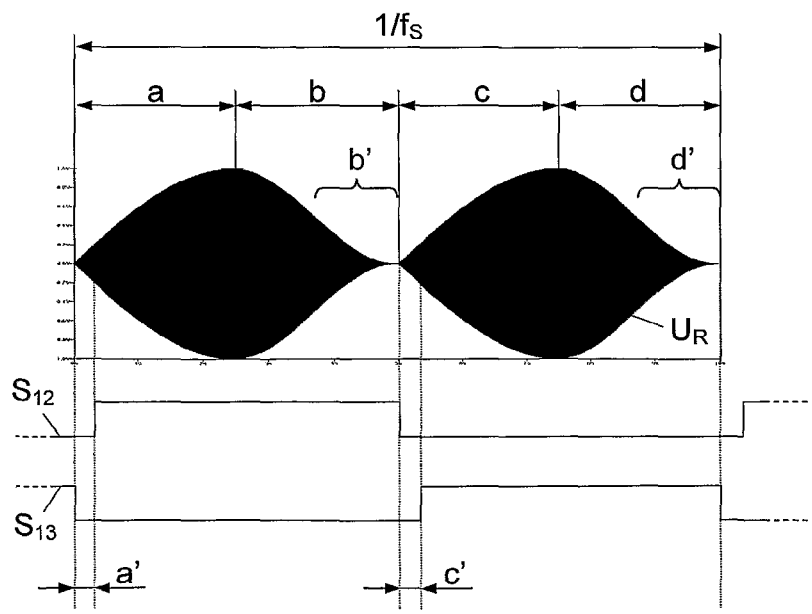
FIG. 5 shows the downward adjustment of the oscillator output voltages in each second quarter period of the low frequency and the switching curves of the rectifier of FIG. 4 to support the load discharge.

The efficacy of the discharging resistor 15 can be increased by slightly reducing the output voltages $U_1$, $U_2$ of the oscillators 6, 7 according to FIG. 5 in the respective second quarters b, d of the four quarters a-d of the period of the low frequency $f_s$, i.e. in particular at the end part b', d' of the quarters b, d, so that the envelope of the resonance voltage $U_R$ no longer has an exactly sinusoidal course there. The precise time behaviour of this voltage reduction in this case is controlled in a control circuit by means of a control unit 16, which measures the generator output voltage $U_s$, in such a manner that taking into consideration the voltage drops in the diode branches 10, 11 and switches 12, 13 and the residual charges in the load 2, a curve of the generator output voltage $U_s$ that is as sinusoidal as possible results overall.

The discharging resistor 15 connected in parallel to the demodulator 4 results in a certain crosstalk of the high frequency $f_R$ to the output frequency L. This effect can be minimised by appropriate dimensioning of the discharging resistor 15 and control of the voltage reduction in the regions b', d' to such an extent that the degree of distortion or total harmonic distortion of the generator output voltage $U_s$ lies below 5% THD, for example.

The discharge of the load 2 during switchover of the rectifier 10-13 can also be promoted by a further measure. The switching patterns $S_{12}$, $S_{13}$ of switches 12, 13 are shown over time in FIG. 5. As may be seen, the actuations $S_{12}$, $S_{13}$ of switches 12, 13 can overlap slightly during the switchover process, i.e. so that the switches 12, 13 are both briefly closed simultaneously directly after the zero crossing of the resonance voltage $U_R$ (regions a', c'). As a result, the transient phenomenon of the generator output voltage $U_s$ during switchover of the rectifier 10-13 can be minimised and there is thus an even better possibility of approaching an ideally sinusoidal curve.

In the shown example of a VLF period $1/f_s$ of 10 s the closure overlap a', c' preferably amounts to approximately 0.1 s. The closure overlap a', c' generally lies in the range of some thousandths to some hundreds of $1/f_s$.

Figure 6:
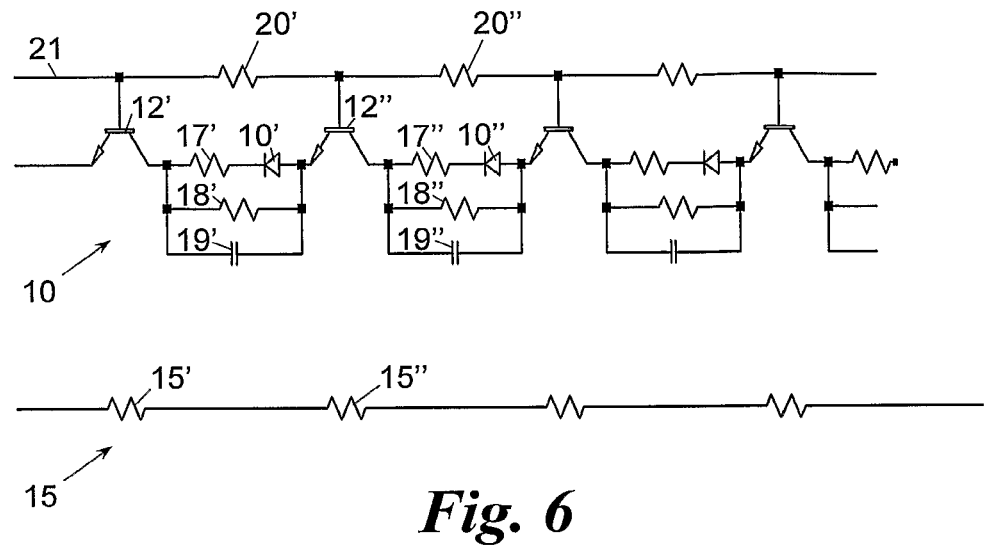
FIGS. 6 and 7 show two alternative embodiments for the diode branches of the rectifier and the discharging resistor of FIG. 4.

FIG. 6 shows a first practical embodiment for the diode branch 10 and the discharging resistor 15 (diode branch 11 is mirror-inverted). As is known in high voltage technology, the diode branch 10 is preferably formed by a chain of individual diodes 10', 10" etc. and interposed single semiconductor switches 12', 12" etc. Each diode 10', 10" is wired with a serial current limiting resistor 17', 17" etc., a parallel test resistor 18', 18" etc. and a parallel safety capacitor 19', 19" etc.

The actuation of the semiconductor switches 12', 12" is illustrated schematically by a control line 21, which is provided with resistors 20', 20" etc. and by means of which the switching signal $S_{12}$ is supplied. The specific actuation connection systems for the semiconductor switches 12', 12" are known to the person skilled in the art and are not represented in more detail here. The discharging resistor 15 is configured from series-connected individual resistors 15', 15" etc. to increase the electric strength.

Figure 7:
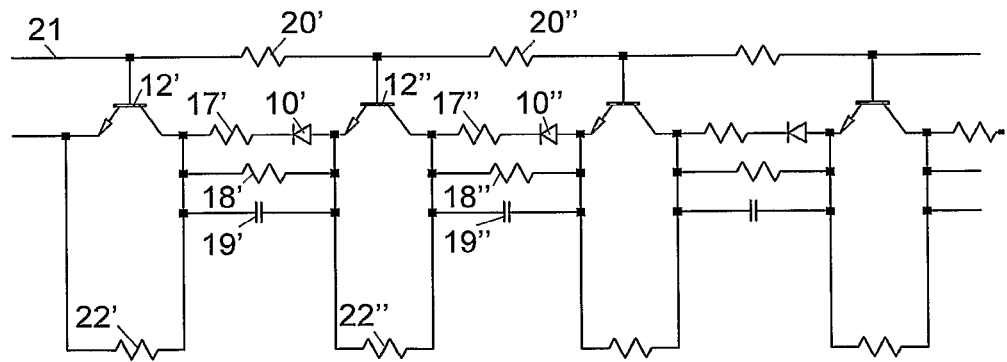

As is shown in FIG. 7, the parallel test resistors 18', 18" of the diodes 10', 10" can also be optionally used to form the discharging resistor 15. For this purpose, resistors 22', 22" etc. are connected in parallel to the semiconductor switches 12', 12" and jointly with the test resistors 18', 18"—as well as the resistor chain of the mirror-inverted diode branch 11 (not shown) arranged parallel thereto—form the discharging resistor 15.

Figure 8:
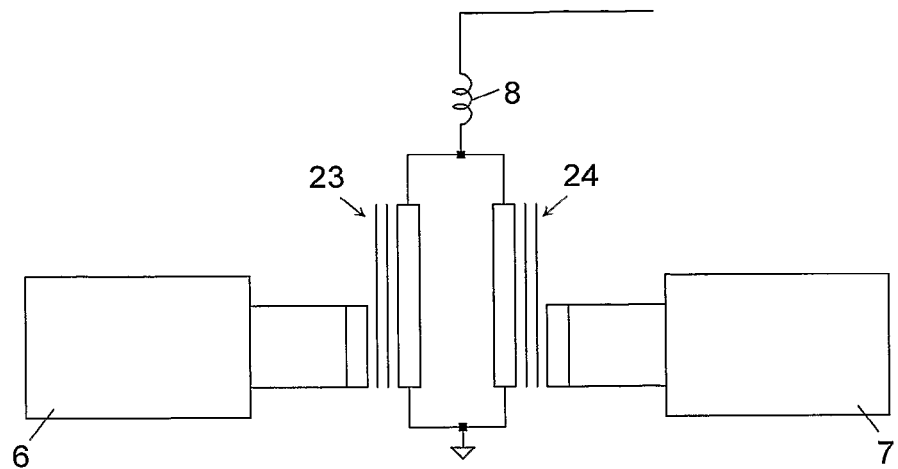
FIGS. 8 to 10 show alternative circuit variants for the connection of the oscillators to the resonant circuit.
Figure 9:
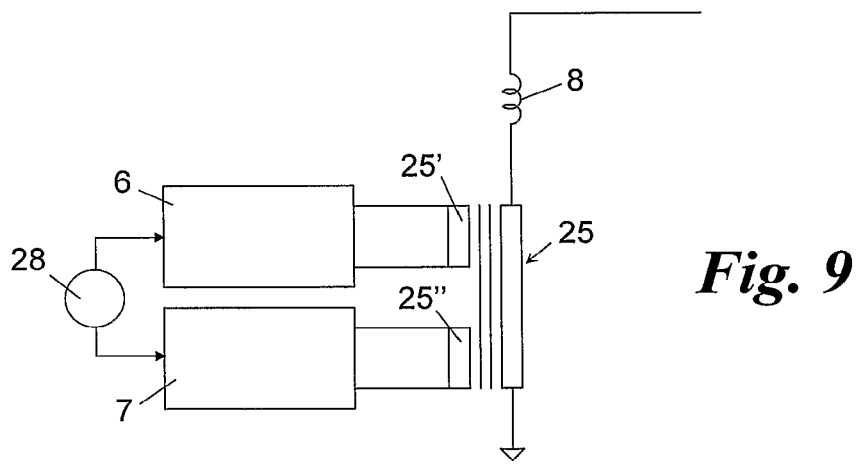
Figure 10:
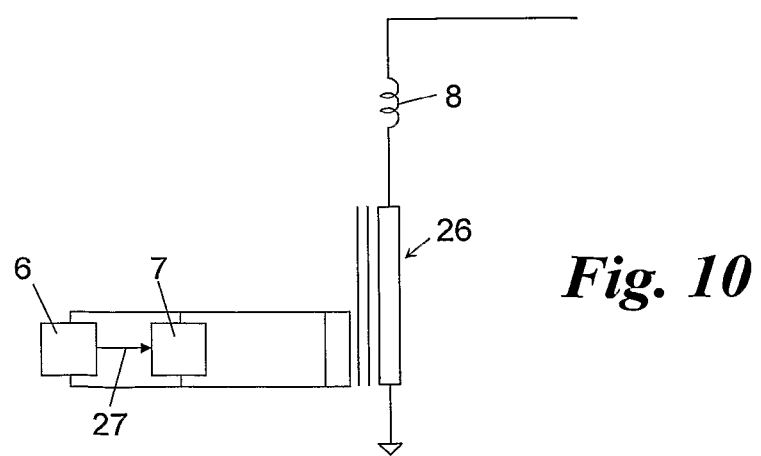

FIGS. 8 to 10 show different practical embodiments of the oscillators 6, 7 and their attachment to the resonant circuit 8, 9 (only shown in part). The oscillators 6, 7 here are respectively formed by semiconductor inverters, the output voltages of which can be controlled as desired both in frequency and in amplitude using microprocessor control (so-called power modules).

In the embodiment of FIG. 8 each oscillator 6, 7 feeds the resonant circuit 8, 9 via its own high-voltage transformer 23, 24. The transformers 23, 24 serve a plurality of purposes: to electrically separate the oscillators 6, 7 from the resonant circuit 8, 9; to electrically separate them from one another, to provide an inductive load for the oscillators 6, 7; and to additionally step up the oscillator output voltages $U_1$, $U_2$ for excitation of the resonant circuit 8, 9. For example, oscillator output voltages $U_1$, $U_2$ of approximately 400 V can thus be stepped up to a resonant circuit exciting voltage of approximately 4 kV, so that with a resonant circuit of quality Q=100, a generator output voltage $U_s$ of approximately 400 kV can be reached.

In the embodiment of FIG. 9 the two oscillators 6, 7 share a joint transformer 25, wherein each oscillator feeds its own primary winding 25', 25" of the transformer 25, these being arranged in series on the transformer core, so that a voltage interference of the oscillator output voltages $U_1$, $U_2$ results again here.

Finally, FIG. 10 shows a further embodiment in which a single high-voltage transformer 26 is used with the oscillators 6, 7 connected electrically in parallel (or in series connection—not shown) to its primary winding, so that the interference of the oscillators occurs as a result of current interference (or voltage interference—not shown) in the primary circuit here.

As illustrated by the arrow 27 in FIG. 10, the oscillator frequency $f_2$ of one oscillator 7 can be derived from the oscillator frequency $f_1$ of the other oscillator 6, as a result of which a high constancy of the beat frequency $f_s = (f_2 - f_1)/2$ can be achieved. Alternatively, the oscillator frequencies $f_1$, $f_2$ of the oscillators 6, 7 can also be derived from a joint clock generator 28, see FIG. 9.

If no particularly high output voltage $U_s$ is required, in place of the voltage transmitting high-voltage transformers 23-26 matching transformers can also be used for impedance matching and electrical separation.

The invention is not restricted to the represented exemplary embodiments, but covers all variants and modifications, in particular also any desired combinations of the shown exemplary embodiments that fall within the scope of the attached claims.

What is claimed is:

1. VLF test generator for generating a high voltage with a low frequency to test the insulation of capacitive loads comprising two oscillators, the oscillator frequencies of which differ from one another by twice said low frequency, a resonant circuit which is fed in an interfering manner by the oscillators and is tuned to the oscillator frequencies for voltage superelevation of the interfering oscillator frequencies, and a demodulator for decoupling the low-frequency high voltage generated by the interference from the resonant circuit and applying same to the load.

2. VLF test generator according to claim 1, wherein the oscillator frequencies lie in the range of about 100 Hz to 10 kHz.

3. VLF test generator according to claim 1, wherein the low frequency lies below 1 hertz.

4. VLF test generator according to claim 1, wherein the quality of the resonant circuit amounts to about 10 to 100.

5. VLF test generator according to claim 1, wherein the interference of the oscillator frequencies is a voltage interference.

6. VLF test generator according to claim 1, wherein each oscillator is formed by a controllable semiconductor inverter.

7. VLF test generator according to claim 1, wherein the oscillators feed the resonant circuit via at least one transformer.

8. VLF test generator according to claim 7, wherein the transformer steps up the oscillator voltages.

9. VLF test generator according to claim 7, wherein each oscillator has its own primary winding of a common transformer which is connected to the resonant circuit.

10. VLF test generator according to claim 1, wherein the oscillator frequency of one oscillator is derived from the oscillator frequency of the other oscillator.

11. VLF test generator according to claim 1, wherein the oscillator frequencies of the oscillators are derived from a common clock generator.

12. VLF test generator according to claim 1, wherein the demodulator also uses the capacitive load and reverses this by means of a rectifier in the cycle of the low frequency.

13. VLF test generator according to claim 12, wherein the rectifier can be switched over in its transmitting direction and switches over upon each half wave of the low frequency.

14. VLF test generator according to claim 13, wherein the rectifier has two antiparallel diode branches provided with switches.

15. VLF test generator according to claim 14, wherein each diode branch is formed by a chain of diodes and interposed semiconductor switches.

16. VLF test generator according to claim 14, wherein the switches are, during switchover, simultaneously closed with a brief overlap.

17. VLF test generator according to claim 12, wherein a discharging resistor for the capacitive load, which connects back to the output of the resonant circuit, is connected in parallel to the demodulator and further wherein the discharging resistor is connected in parallel to the rectifier.

18. VLF test generator according to claim 17,
wherein the rectifier can be switched over in its transmitting direction and switches over upon each half wave of the low frequency;
wherein the rectifier has two antiparallel diode branches provided with switches;
wherein each diode branch is formed by a chain of diodes and interposed semiconductor switches; and
wherein a single resistor is connected in parallel to each diode and each semiconductor switch which single resistors jointly form said discharging resistor.

19. VLF test generator according to claim 1, further comprising a discharging resistor for the capacitive load, which connects back to the output of the resonant circuit, is connected in parallel to the demodulator.

20. VLF test generator according to claim 19, further comprising a control means is provided for the oscillators, which reduces the amplitude of their output voltages at the end of each second quarter of the period of the low frequency in order to support the discharge of the load via the discharging resistor.

21. VLF test generator according to claim 1, wherein the oscillator frequencies lie in the range of about 500 Hz to 5 kHz.

22. VLF test generator according to claim 1, wherein the oscillator frequencies are about 1 kHz.

23. VLF test generator according to claim 1, wherein the low frequency lies at about 0.1 hertz.

* * * * *